United States Patent [19]

Howie

[11] 4,404,644
[45] Sep. 13, 1983

[54] WAVEFORM GENERATOR

[75] Inventor: Ian H. Howie, Glasgow, Scotland

[73] Assignee: Barr & Stroud Limited, Glasgow, Scotland

[21] Appl. No.: 263,516

[22] Filed: May 14, 1981

[30] Foreign Application Priority Data

May 22, 1980 [GB] United Kingdom ............... 8017013

[51] Int. Cl.³ .............................................. G06F 1/02
[52] U.S. Cl. ...................................... 364/718; 328/14
[58] Field of Search ................ 364/487, 607, 718–722; 328/14; 307/260

[56] References Cited

U.S. PATENT DOCUMENTS

| | | | |
|---|---|---|---|
| 4,001,557 | 1/1977 | Stephenson | 364/718 |
| 4,064,423 | 12/1977 | Atkisson, Jr. | 364/718 |
| 4,283,768 | 8/1981 | Scott | 328/14 |
| 4,335,442 | 6/1982 | Backe | 364/487 |
| 4,346,448 | 8/1982 | Insam et al. | 328/14 |

Primary Examiner—Gary Chin
Attorney, Agent, or Firm—Mason, Fenwick & Lawrence

[57] ABSTRACT

A waveform generator for generating a plurality of repetitive digital waveforms having a common repetition period which is an integral number of periods of a clock signal, the transitions of each waveform during the repetition period occurring synchronously with pulses of the clock signal comprises a digital storage device E which is preprogrammed with waveform data and with time interval data for each of the waveforms, an address counter D, an interval counter G, a latch F and a clock pulse source Y. The interval counter G is arranged to count to a predetermined count number when it is reset to a value determined by the time interval data present at the output of the storage device E and this sequence is repeated. Shortly after the predetermined count number is achieved the interval counter G supplies an address bit to the storage device E and a count signal to the address counter D so that the device E delivers the pertaining waveform data. Shortly before the predetermined count number is next achieved by the interval counter G it delivers a latch operation signal to latch F thereby transferring the available waveform data to the output thereof and this sequence is repeated.

1 Claim, 2 Drawing Figures

WAVEFORM GENERATOR

This invention relates to a waveform generator for generating a number N of periodic digital waveforms, these waveforms having a common repetition period which is an integral number, M, periods of an externally-generated clock signal, the transitions of the N waveforms during said repetition period occurring synchronously with pulses of the clock signal. The information necessary to define the waveforms is stored in a PROM or other digital storage device.

Figure 1:
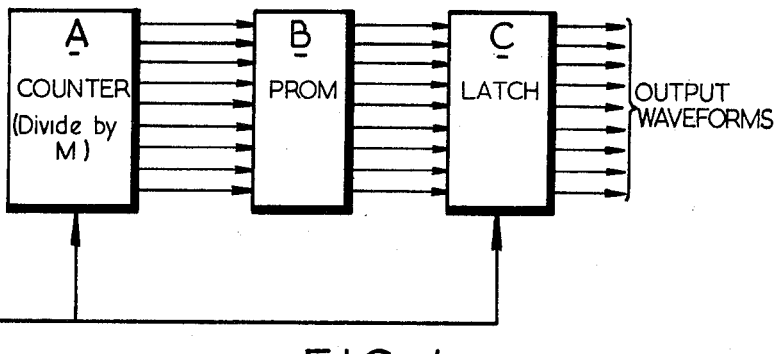

A known means of generating such waveforms is illustrated in FIG. 1. It consists of a counter A arranged to divide by M, a PROM, B, which is addressed by the outputs of counter A and which provides waveform data to a latch C. Both A and C are driven by an externally-generated clock X. Latch C eliminates spurious transitions in the outputs of PROM B which occur when the outputs of counter A are changing. PROM B must be capable of storing M words of data each of N bits. In cases in which M is large and the transitions in the output waveforms are generally many clock periods apart, the storage required is great and largely redundant since many of the stored words are identical.

The waveform generator of the present invention is intended to achieve a substantial reduction in the size of PROM required without a significant increase in system complexity.

According to the present invention there is provided a waveform generator for generating a plurality of repetitive digital waveforms having a common repetition period which is an integral number of periods of a clock signal, the transitions of waveform during said repetition period occurring synchronously with pulses of the clock signal, said generator comprising:
- a digital storage device programmed with waveform data and with time interval data for each of said waveforms,
- an address counter for addressing the storage device,
- an interval counter and a latch connected in parallel to the output of the storage device, and
- a clock pulse source connected to drive the count input of the interval counter, wherein the interval counter is arranged to drive the latch and the count input of the address counter.

Figure 2:
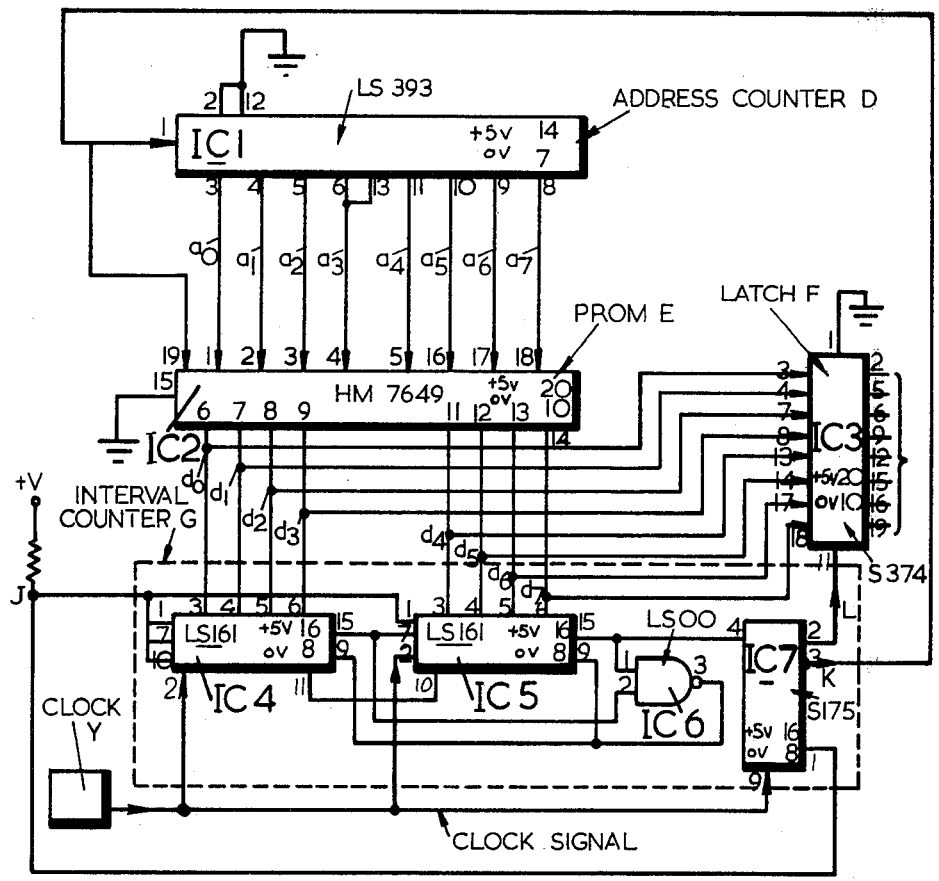

An implementation of the present invention is shown in block schematic form in FIG. 2. It consists of a counter D which generates addresses, $a_0$, $A_1$, ... $a_7$ for a PROM E. The outputs $d_0$, $d_1$, ... $d_7$ of PROM E feed a latch F which provides the required output waveforms, and a loadable interval counter G. Counter G is formed by IC4 and IC5 each of which is a 4 bit counter together with NAND gate IC6 and latch IC7. To enable components IC4, IC5 and IC7 of counter G a permanently high signal J is provided in a manner known per se. The outputs of G are a latching signal L which drives latch F and a signal K (in this case the logical complement of L) which increments the counter D and provides an additional address bit for PROM E. The interval counter G is designed to count clock pulses from clock Y until it reaches a fixed terminal value p (in this case 255 decimal) which is detected by NAND gate IC6 which then goes low for one clock pulse thereby providing a loading signal (to pins 9 of IC4 and IC5). On the next clock pulse counter G is loaded with the current output of PROM E which sets counter G to a value q. Counter G then counts up to p again when the next load takes place. The interval between the loads is therefore (p−q+1) clock periods long. The interval counter has to reach a fixed number r of clock pulses before each signal L goes high and a fixed number s of clock pulses after each signal L returns to low. In this case, r and s are 7 and 1 respectively.

The contents of the PROM E are arranged so that when the signal K is low (and K is the complement of L), time interval data for loading counter G is available at its output whereas, when K is high, waveform data for latch F is available. Time interval data identifies the time intervals between the various transitions required by the several waveforms over their common period and waveform data identifies the amplitudes of the several waveforms during each time interval.

The operation of the generator in its entirety is thus as follows. Suppose that the address counter D is at zero and that the signal K is high. Waveform data is therefore available at the output of PROM E. When the interval counter G reaches r clock pulses prior to loading, signal L goes high, this transition causing the waveform data to be transferred to the output of the latch F. Simultaneously, K goes low which transition advances the counter D by one count. After propagation delays in the counter D and PROM E, time interval data becomes available at the output of PROM E where, at the p+1 clock pulse, it is loaded into the interval counter G. It should be noted that r must be chosen to allow for the aforementioned propagation delays; s clock periods after the data is loaded into counter G, K again goes high thereby addressing PROM E so that waveform data for the next time interval becomes available at the PROM output (but without affecting counter D and without the corresponding L signal transition affecting latch F). This waveform data will be transferred to the latch output only when the interval counter G is within r clock periods of reloading itself and is prevented from being loaded into counter G because of the absence of a loading signal. The original waveform data therefore remains present at the latch output for a time interval corresponding to the value loaded into counter G. As the counter D increments, fresh values of waveform data alternating with corresponding time interval data are available at the output of the Prom E and are supplied to the latch F and counter G respectively. Eventually, D counts through all its states and returns to the state zero indicating that a complete cycle of the system (and hence the output waveforms) has occurred.

It will be appreciated that the waveform generator of the present invention is of particular utility in thermal imagers where there is a requirement for several (e.g. six) control signals for controlling the operation of the signal processing circuitry between the detector and the video display all of these control signals being very accurately timed in relation to a master clock signal. Individually the control signals are relatively simple having only one or two ON/OFF transitions (digitally) per period, but the exact location of these transitions is critical. For this purpose the control signal period may be of the order of several thousand times greater than the period of the clock signal. Thus in the prior art form of waveform generator because the address counter is clocked by the clock signal it requires to count through several thousand clock periods before returning to its starting count number and likewise the digital storage device (or PROM) requires a like number of several thousand entries. However with the present invention the capacitor of the digital storage device (or PROM)

can be drastically reduced since the address counter D is not clocked by the clock signal but by an intermediate control signal (K) derived therefrom by the interval counter G in accordance with the number of transitions required in the several output control waveforms provided by the generator.

In the embodiment the interval counter G comprises an 8 bit counter formed by two 4 bit counters connected in cascade but it will be appreciated that with availability of components a single 8 bit counter could be used.

What is claimed is:

1. A waveform generator for generating a plurality of repetitive rectangular wave type waveforms having a common repetition period which is an integral number of periods of a clock signal, each waveform being digital (i.e., either ON or OFF) and having transitions between ON and OFF occurring synchronously with pulses of the clock signal, said generator comprising:

a digital storage device preprogrammed with waveform data and with time interval data for said waveforms, said time interval data identifying the time intervals between successive transitions of the plurality of said waveforms over their common repetition period and said waveform data identifying the respective amplitudes of the plurality of waveforms during each said time interval, address means including an address counter for addressing the storage device to deliver selected data at the output of the storage device, an interval counter and a waveform-delivery latch connected in parallel to the output of the storage device, and a clock pulse source connected to the count input of the interval counter to advance the count number in the interval counter, wherein said interval counter includes a loading circuit which is intermittently activated by the interval counter attaining a predetermined count number, the activated loading circuit being effective to load data at the output of the storage device into the interval counter and to preset the count number therein to a value determined by the loaded data, means included in said loading circuit for delivering a first output signal to said latch to condition the latch to transfer the data at the output of the storage device to the latch output each time the count number for the interval counter equals a fixed small number of clock pulses less than said predetermined count number, for delivering a second output signal to the count input of the address counter to advance the count therein, and for delivering a third output signal as an address bit in addition to the address bits from the said address counter to address the storage device to deliver time-interval data for loading into said interval counter, and means for delivering a fourth output signal as an address bit in addition to the address bits from the said address counter to address the storage device to deliver waveform data for transfer to the latch output each time a fixed small number of clock pulses has been delivered to the interval counter after attainment of said predetermined count number.

* * * * *